United States Patent
Maeda

[11] Patent Number: 5,168,503
[45] Date of Patent: Dec. 1, 1992

[54] HARMONIC GENERATOR

[75] Inventor: Takanori Maeda, Tokorozawa, Japan

[73] Assignee: Pioneer Electronic Corporation, Tokyo, Japan

[21] Appl. No.: 699,013

[22] Filed: May 13, 1991

[30] Foreign Application Priority Data

Nov. 15, 1990 [JP] Japan .................................. 2-310195

[51] Int. Cl.⁵ ............................................. H01S 3/10
[52] U.S. Cl. ........................................ 372/22; 372/92; 372/94; 372/34; 372/28; 372/26; 372/32; 372/29; 372/21
[58] Field of Search ....................... 372/29, 32, 21, 22, 372/26, 28, 20, 92, 94, 34

[56] References Cited

U.S. PATENT DOCUMENTS

| | | | |
|---|---|---|---|
| 3,858,056 | 12/1974 | Melamed et al. | 372/34 |
| 4,019,159 | 4/1977 | Hon et al. | 372/34 |
| 5,063,568 | 11/1991 | Chiba et al. | 372/32 |

Primary Examiner—Léon Scott, Jr.
Attorney, Agent, or Firm—Sughrue, Mion, Zinn, Macpeak & Seas

[57] ABSTRACT

A drive current is modulated by a current modulator, and the modulated drive current is supplied to a laser beam generator so that the laser beam emitted by the laser beam generator is varied in wavelength. The laser beam is applied to a frequency converter, and the maximum intensity of the laser beam from the frequency converter is detected by the light detector. Based on the detected intensity, the temperature of the laser beam generator is regulated by a temperature regulator. The wavelength of the laser beam generated by the laser beam generator is thus controlled so as to be best suited to the phase matching condition of the frequency converter. The harmonic generator is simple in arrangement and small in size, and can operate stably over a long period of time without deterioration due to aging.

12 Claims, 4 Drawing Sheets

HARMONIC GENERATOR

BACKGROUND OF THE INVENTION

The present invention relates to an optical harmonic generator for converting the characteristics of an optical beam using the nonlinear optical effect of a substance, and more particularly to an optical harmonic generator which can stably produce harmonics based on optical harmonic generation, parametric excitation, or the like.

Heretofore, it is known that harmonics such as a second harmonic can be generated on the principle that when a laser beam is applied to a nonlinear optical element, the wavelength of a laser beam emitted from the nonlinear optical element is reduced by one half. It is now assumed that the laser beam applied to the nonlinear optical element is referred to as an $\omega$ wave having an angular frequency of $\omega$ and the laser beam emitted from the nonlinear optical element is referred to as a $2\omega$ wave, i.e., a second harmonic, having an angular frequency $2\omega$.

One conventional harmonic generator in the form of a ½-wavelength light generator is illustrated in FIG. 9 of the accompanying drawings.

The ½-wavelength light generator comprises a semiconductor laser 1 for emitting a laser beam ($\omega$ wave) having an angular frequency of $\omega$, a frequency converter 2 for applying the laser beam ($\omega$ wave) to a nonlinear optical crystal to cause the nonlinear optical crystal to generate a laser beam ($2\omega$ wave) having an angular frequency of $2\omega$, a condensing lens 8 for converging the $\omega$ wave from the semiconductor laser 1 onto the center of the nonlinear optical crystal of the frequency converter 2, a semiconductor laser driver power supply 9 for supplying a drive current to the semiconductor laser 1, a semiconductor laser temperature regulator 51 for regulating the temperature of the semiconductor laser 1 at a constant level, and a crystal temperature regulator 10 for regulating the temperature of the nonlinear optical crystal of the frequency converter 2 at a constant level.

The $\omega$ wave applied to the nonlinear optical crystal of the frequency converter 2 may be an infrared radiation having a wavelength of 860 [nm], for example, and the $2\omega$ wave emitted from the nonlinear optical crystal through frequency conversion may be blue light having a wavelength of 430 [nm], for example. If the nonlinear optical crystal is of potassium niobate, its temperature is maintained at a constant 25° C. by the crystal temperature regulator 10.

Operation of the conventional ½-wavelength light generator shown in FIG. 9 will be described below.

A constant drive current $I_1$ is supplied from the semiconductor laser driver power supply 9 to the semiconductor laser 1, which then emits an $\omega$ wave having a frequency of $\omega$ corresponding to the drive current $I_1$. The $\omega$ wave thus emitted is converged by the condensing lens 8 and applied as a convergent laser beam to the center of the nonlinear optical crystal of the frequency converter 2.

In the nonlinear optical crystal of the frequency converter 2, the introduced $\omega$ wave is increased in energy density as a convergent Gaussian beam, and converted in frequency into a $2\omega$ wave with high efficiency. In order to effect efficient generation of the $2\omega$ wave with high efficiency, it is necessary that the $\omega$ wave and the $2\omega$ wave be brought into phase with each other, i.e., that so-called phase matching be achieved, in the nonlinear optical crystal. The condition for achieving such phase matching is given by the following equation:

$$\sin^2\theta_m = \{(n_o^\omega)^{-2} - (n_o^{2\omega})^{-2}\}/\{(n_c^{2\omega})^{-2} - (n_o^{2\omega})^{-2}\} \quad (1)$$

where $n_o$ is a refractive index with respect to ordinary rays of light, $n_e$ is a refractive index with respect to extraordinary rays of light, $\omega$ and $2\omega$ are angular frequencies, and $\theta_m$ is an angle at which the nonlinear optical crystal is cut in order to obtain a phase matching angle.

To achieve the phase matching based on birefringence of the nonlinear optical crystal in order to satisfy the phase matching condition expressed by the equation (1) mentioned above, the temperature of the nonlinear optical crystal is kept at a constant value by the crystal temperature regulator 10 so as to enable the nonlinear optical crystal to maintain a desired refractive index. Since the $\omega$ wave generated by the semiconductor laser 1 varies in wavelength depending on its temperature, the temperature of the semiconductor laser 1 is also maintained at a constant level by the semiconductor laser temperature regulator 51.

When the wavelength of the $\omega$ wave generated by the semiconductor laser 1 is thus maintained at a constant level and the refractive index of the nonlinear optical crystal of the frequency converter 2 is thus kept at a constant value, the phase matching condition of the ½-wavelength light generator is satisfied, making it possible to effect second harmonic generation (SHG).

If the wavelength of the $\omega$ wave changes to another wavelength, then since there is a different nonlinear optical crystal temperature corresponding to that other wavelength, it is possible to achieve phase matching at the different nonlinear optical crystal temperature. However, even if the wavelength of the $\omega$ wave changes to not only a longer wavelength but also a shorter wavelength, the output power of the $2\omega$ wave is reduced in the same manner, making it impossible to determine a direction in which the temperature should vary. To avoid the above drawback, the temperature of the semiconductor laser 1 and the value of the drive current have to be kept constant to maintain the wavelength at a constant level, and at the same time it is necessary to maintain the temperature of the nonlinear optical crystal at a constant value for phase matching.

For maximum frequency conversion efficiency, the semiconductor laser 1 and the nonlinear optical crystal of the frequency converter 2 need to be associated with the respective temperature regulators 51, 10. Therefore, the entire device arrangement is complex and large in size. Since all of the temperature of the nonlinear optical crystal of the frequency converter 2, the temperature of the semiconductor laser 1 and the drive current of the semiconductor laser 1 are held constant during operation, when the wavelength of the laser beam emitted from the semiconductor laser 1 varies with respect to the supplied drive current due to aging, for example, the efficiency with which the $2\omega$ wave generates is lowered by a degree which corresponds to the wavelength change. Accordingly, the conventional ½-wavelength light modulator is unable to operate stably over a long period of time.

SUMMARY OF THE INVENTION

In view of the aforesaid shortcomings of the conventional harmonic generator, it is an object of the present invention to provide a harmonic generator which is simple in arrangement and stable in operation, and which includes a laser beam generator whose temperature is controlled to vary a laser beam wavelength, on the basis of the wavelength of a maximum laser beam output that is determined by modulating a drive current supplied to the laser beam generator.

According to the present invention, there is provided a harmonic generator comprising laser beam generating means for generating a laser beam having an angular frequency, optical frequency converting means, comprising a nonlinear optical crystal for passing the laser beam therethrough, for converting the laser beam applied to the nonlinear optical crystal into a laser beam having an angular frequency different from the angular frequency of the laser beam applied to the nonlinear optical crystal, and for emitting the converted laser beam, current modulating means for producing a modulating signal to modulate a drive current supplied to the laser beam generating means, light detecting means for detecting the intensity of the laser beam emitted by the optical frequency converting means, and for producing an intensity signal representative of the detected intensity, and temperature regulating means for controlling the temperature of the laser beam generating means based on the modulating signal from the current modulating means and the intensity signal from the light detecting means.

A drive current is modulated by the current modulating means, and the modulated drive current is supplied to the laser beam generating means so that the laser beam emitted by the laser beam generating means is varied in wavelength. The laser beam is applied to the frequency converting means, and the maximum intensity of the laser beam from the frequency converting means is detected by the light detecting means. Based on the detected intensity, the temperature of the laser beam generating means is regulated by the temperature regulating means. The wavelength of the laser beam generated by the laser beam generating means is thus controlled so as to be best suited to the phase matching condition of the frequency converting means. The harmonic generator is simple in arrangement and small in size, and can operate stably over a long period of time without deterioration due to aging.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
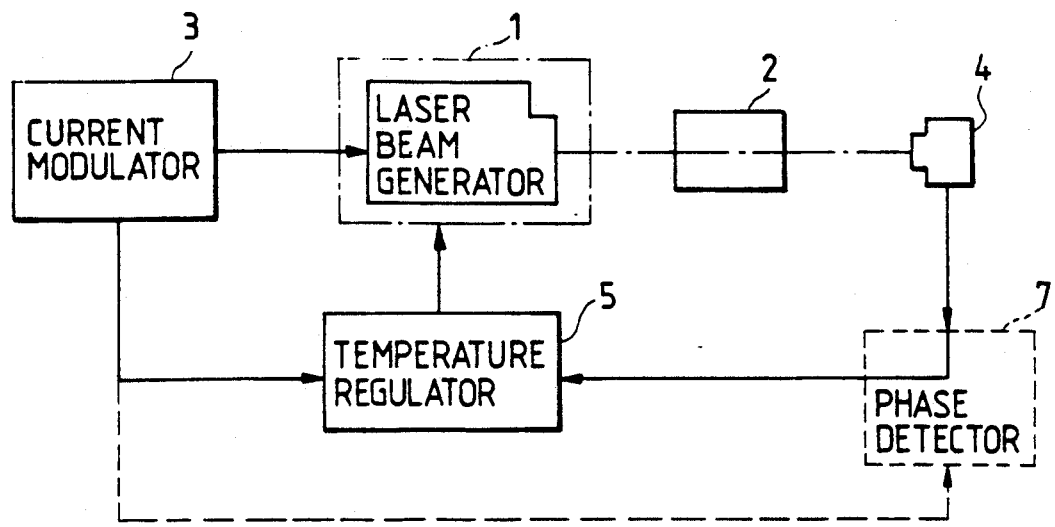
FIG. 1 is a block diagram illustrative of the principles of the present invention.

FIG. 1 illustrates the principles of a harmonic generator according to the present invention.

In FIG. 1, the harmonic generator according to the present invention includes a laser beam generator 1 for generating a laser beam having a certain angular frequency, an optical frequency converter 2 composed of a nonlinear optical crystal for passing the laser beam from the laser beam generator 1 therethrough, the optical frequency converter 2 serving to produce a laser beam having an angular frequency which is different from the angular frequency of the laser beam applied thereto by the laser beam generator 1, a current modulator 3 for producing a modulating signal to modulate a drive current to be supplied to the laser beam generator 1, a light detector 4 for detecting the intensity of the laser beam, with the converted angular frequency, produced by the optical frequency converter 2 and for producing an intensity signal indicative of the detected intensity of the laser beam, and a temperature regulator 5 for controlling the temperature of the laser beam generator 1 based on the modulating signal produced by the current modulator 3 and the intensity signal produced by the light detector 4.

A harmonic generator according to an embodiment of the present invention will be described below with reference to FIG. 2.

Figure 2:
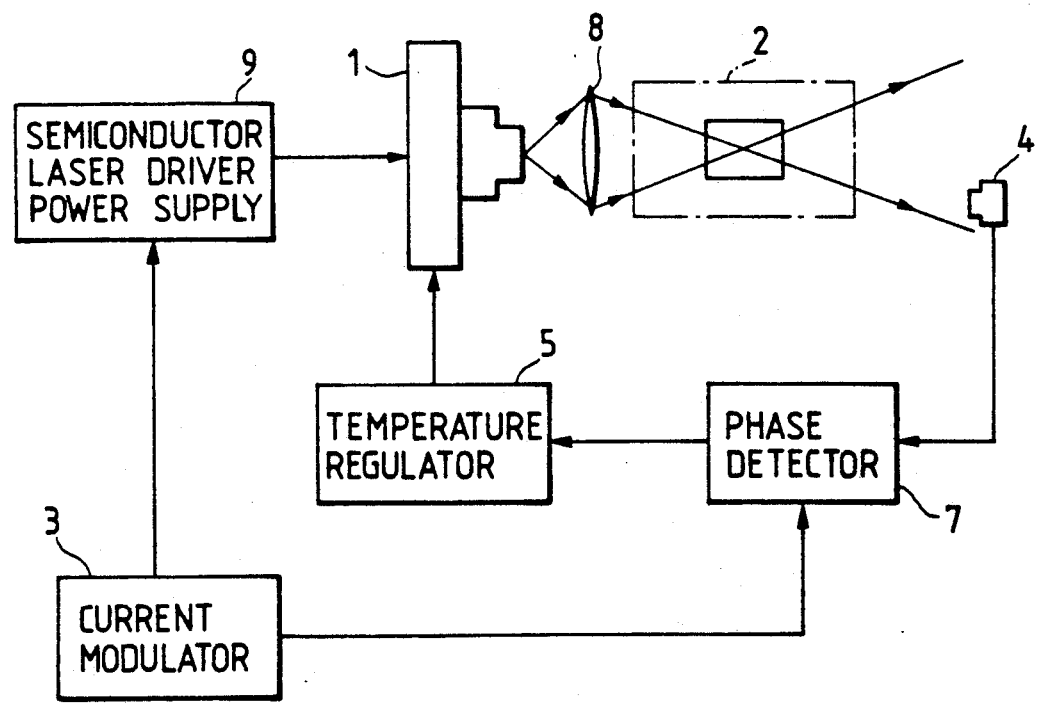
FIG. 2 is a block diagram of a harmonic generator according to an embodiment of the present invention.
Figure 9:
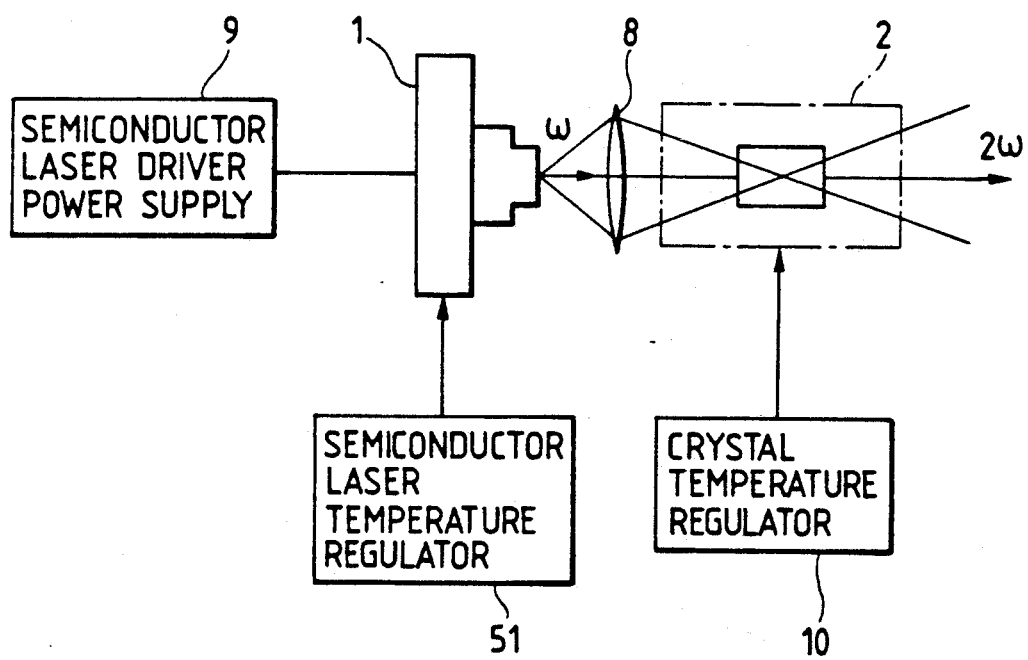
FIG. 9 is a block diagram of a conventional harmonic generator.

The harmonic generator shown in FIG. 2 includes a semiconductor laser 1, a frequency converter 2, a condensing lens 8, and a semiconductor laser driver power supply 9, which are identical to those of the conventional harmonic generator shown in FIG. 9. In addition, the harmonic generator according to the embodiment of the present invention also includes a current modulator 3 for supplying to the semiconductor laser driver power supply 9 a modulating signal which modulates the frequency of a drive current, which is supplied from the semiconductor laser driver power supply 9 to the semiconductor laser 1, in a range from 10 [Hz] to 100 [Hz], a light detector 4 for detecting the intensity of a $2\omega$ wave produced, by way of frequency conversion, from the frequency converter 2, and producing an intensity signal produced by the light detector 4 based on the modulating signal, as a reference signal, produced by the current modulator 3, and a temperature regulator 5 for regulating the temperature of the semiconductor laser 1 based on a phase signal produced by the phase detector 7.

Figure 3:
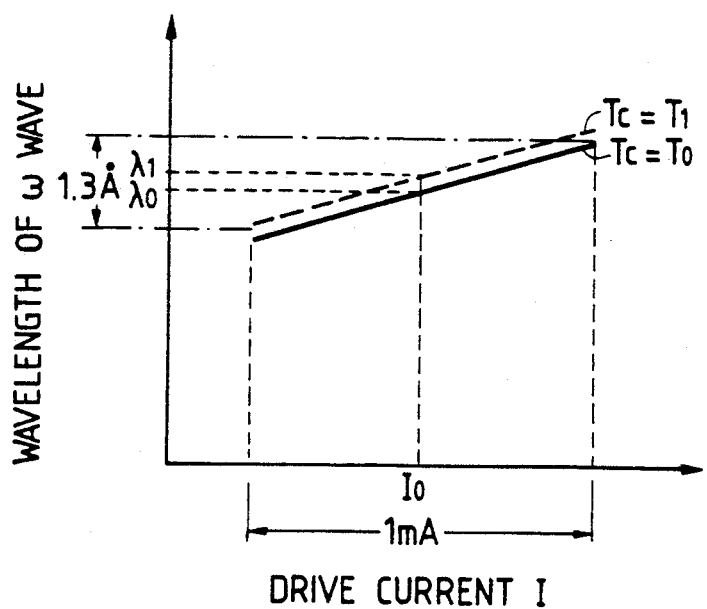
FIG. 3 is a graph showing the relationship between a drive current and the wavelength of an $\omega$ wave with the harmonic generator shown in FIG. 2.
Figure 4:
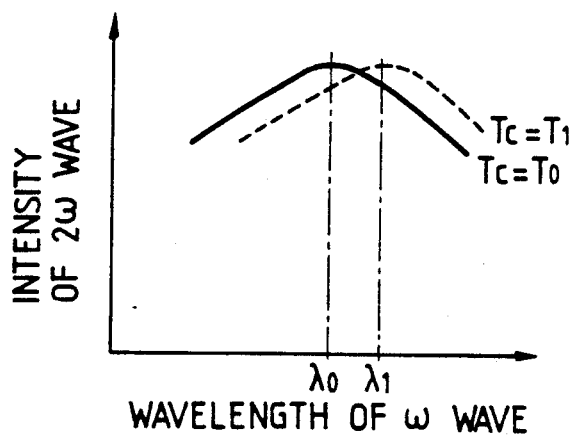
FIG. 4 is a graph showing the relationship between the wavelength of an $\omega$ wave and the intensity of a $2\omega$ wave with the harmonic generator shown in FIG. 2.

Operation of the harmonic generator shown in FIG. 2 will be described below with reference to FIGS. 3 through 5.

A drive current I to be supplied from the semiconductor laser driver power supply 9 to the semiconductor laser 1 is modulated by a modulating signal produced by the current modulator 3. Specifically, the frequency of the drive current I is modulated gradually in a range from 10 [Hz] to 100 [Hz], for example. The modulated drive current I is supplied to the semiconductor laser 1. The modulation frequency range referred to above is selected so as not to overlap a high-frequency range used to transmit information with a laser beam which is generated by the semiconductor laser 1 based on the modulated drive current I.

Based on the applied drive current I, the semiconductor laser 1 emits a $\omega$ wave in the form of a laser beam whose wavelength gradually varies with the drive current I. The wavelength of the $\omega$ wave varies by about 1.3 Å if the modulation amplitude of the drive current I is about 1 [mA], for example. The relationship between the drive current I and the wavelength of the $\omega$ wave is shown in FIG. 3 when the temperature Tc of the casing of the semiconductor laser 1 is $T_0$ (the curve shown by the solid line) and $T_1$ (the curve shown by the broken line). The wavelength of the $\omega$ wave emitted by the semiconductor laser 1 varies by about 3 Å when the temperature Tc varies by 1° C.

The $\omega$ wave whose wavelength varies is converged onto the center of the nonlinear optical crystal of the frequency converter 2 by the condensing lens 8. The frequency converter 2 converts the frequency of the applied $\omega$ wave into the frequency of the $2\omega$ wave. The relationship between the wavelength of the $\omega$ wave and the intensity of the $2\omega$ wave is shown in FIG. 4 when the temperature Tc is $T_0$ (the curve shown by the solid line) and $T_1$ (the curve shown by the broken line). The graph of FIG. 4 indicates that when the temperature Tc is $T_0$ and the wavelength of the $\omega$ wave is $\lambda_0$, phase matching is achieved and the $2\omega$ wave is produced with maximum intensity by the frequency converter 2, and when the temperature Tc is $T_1$ and the wavelength of the $\omega$ wave is $\lambda_1$, phase matching is achieved and the $2\omega$ wave is produced with maximum intensity by the frequency converter 2.

The intensity of the $2\omega$ wave emitted from the frequency converter 2 is detected by the light detector 4. The intensity signal from the light detector 4 and the modulating signal from the current modulator 3 are applied to the phase detector 7. Based on the modulating signal, the phase detector 7 detects the phase of the intensity signal to determine whether the wavelength of the $\omega$ wave emitted from the semiconductor laser 1 is greater or smaller than the wavelength $\lambda_0$ where the frequency conversion efficiency is maximum, and transmits a phase signal, indicative of the detected phase, to the temperature regulator 5.

Figure 5:
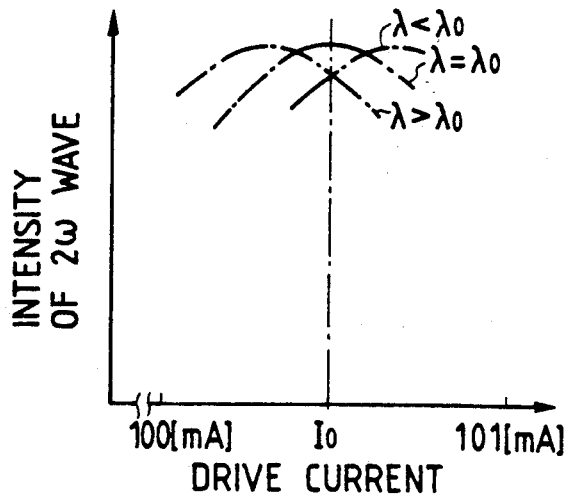
FIG. 5 is a graph showing the relationship between a drive current and the intensity of a $2\omega$ wave with the harmonic generator shown in FIG. 2.

The relationship between the drive current I and the intensity of the $2\omega$ wave is illustrated in FIG. 5. When the drive current varies from 100 [mA] to 101 [mA] including a value $I_0$ at the time the temperature Tc is $T_0$, the difference between the value of the wavelength $\lambda$ where the intensity of the $2\omega$ wave is maximum and the wavelength $\lambda_0$ for maximum frequency conversion efficiency is regarded as an error deviation from the wavelength $\lambda_0$.

The temperature regulator 5 regulates the temperature of the semiconductor laser 1 based on the supplied phase signal which is representative of such an error. If the detected wavelength $\lambda$ is longer than the wavelength $\lambda_0$ for maximum frequency conversion efficiency, then the temperature of the casing of the semiconductor laser 1 is lowered, thereby shortening the wavelength of the $\omega$ wave emitted from the semiconductor laser 1. If the detected wavelength $\lambda$ is shorter than the wavelength $\lambda_0$ for maximum frequency the semiconductor laser 1 is increased, thereby increasing the wavelength of the $\omega$ wave emitted from the semiconductor laser 1.

By thus modulating the drive current, in response to which the wavelengths of the laser beams (the $\omega$ and $2\omega$ waves) vary quickly, the difference between the wavelenght of the $\omega$ wave and the wavelength $\lambda_0$ for the maximum frequency conversion efficiency of the frequency converter 2 is immediately detected, and the temperature of the casing of the semiconductor laser 1 is regulated on the basis of the detected phase or wavelength difference. Accordingly, the $\omega$ wave or laser beam which is best suited to the condition of the frequency converter 1 can be emitted from the semiconductor laser 1 at all times.

Figure 6:
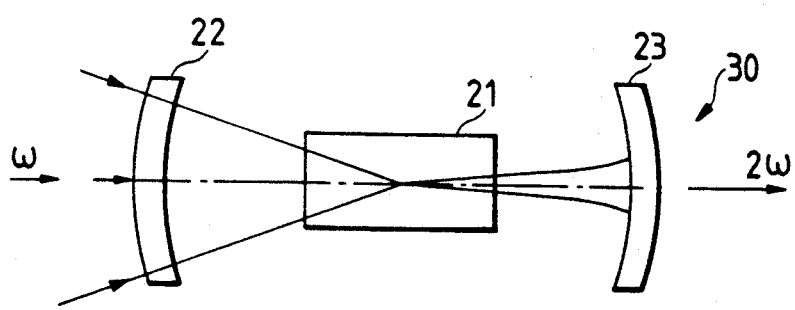
FIGS. 6 through 8 are views of frequency converters according to other embodiments of the present invention.
Figure 7:
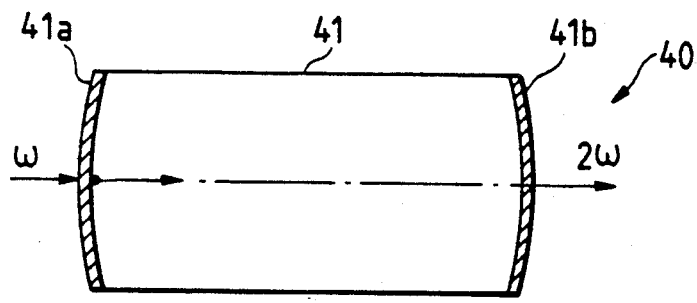
Figure 8:
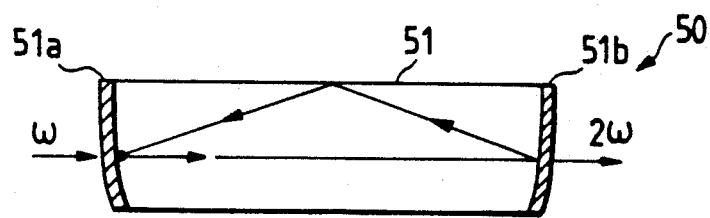

FIGS. 6 through 8 show respective frequency converters according to other embodiments of the present invention.

A frequency converter 30 shown in FIG. 6 comprises a nonlinear optical crystal 21 housed in a Fabry-Perot resonator comprising two spaced concave filter mirrors 22, 23.

As shown in each of FIGS. 7 and 8, a frequency converter 40 may be in the form of a monolithic doubling cavity. More specifically, in FIG. 7, the frequency converter 40 comprises, nonlinear optical element 41, mirror 41a, 41b arranged at both sides of nonlinear optical element 41 and which comprises a standing-wave cavity achieves phase matching with respect to both $\omega$ waves or laser beams which are propagated in forward and rearward directions, for thereby producing two second harmonics or $2\omega$ waves. The mirror 41b passes the $2\omega$ waves selectively. In FIG. 8, the frequency converter 50 comprises a ring-type resonator which have nonlinear optical element 51, mirror 51a, 51b for achieving phase matching with respect to only an $\omega$ wave or a laser beam which is propagated in a forward direction, for thereby producing a second harmonic or a $2\omega$ wave only in one direction.

In the harmonic generator in the above embodiments, the phase of the intensity signal is detected by the phase detector 7 for the control of the temperature of the casing of the semiconductor laser 1. However, the harmonic generator may be arranged such that the temperature of the casing of the semiconductor laser 1 may be controlled on the basis of the intensity signal from the light detector 4. While the harmonic generator in the illustrated embodiments effects second harmonic generation (SHG) by applying the $\omega$ wave to the frequency converter 2 and emitting the $2\omega$ wave from the frequency converter 2, the harmonic generator may be arranged to generate other higher harmonics such as a third harmonic. The frequency converter 2 may be arranged as a nonlinear optical device for effecting parametric excitation or sum-frequency generation to produce a laser beam having an angular frequency of $\omega 3$ in response to application of plural laser beams having different angular frequencies of $\omega 1$, $\omega 2$.

Although the semiconductor laser is employed as a light source in the above embodiments, another light source such as a light-emitting diode or the like may be employed insofar as the wavelength of light emitted thereby is variable with the drive current and temperature.

With the present invention, as described above, the drive current is modulated by the current modulator, and the modulated drive current is supplied to the laser beam generator so that the laser beam emitted by the laser beam generator is varied in wavelength. The laser beam is applied to the frequency converter, and the maximum intensity of the laser beam from the frequency converter is detected by the light detector. Based on the detected light intensity, the temperature of the laser beam generator is regulated by the temperature regulator. The wavelength of the laser beam generator is thus controlled so as to best suited to the phase matching condition of the frequency converter. The harmonic generator according to the present invention is simple in arrangement and small in size, and can operate stably a long period of time without deterioration due to aging.

Although certain preferred embodiments have been shown and described, it should be understood that many changes and modifications may be made therein without departing from the scope of the appended claims.

What is claimed is:

1. A harmonic generator comprising:
   laser beam generating means for generating a laser beam having an angular frequency;
   optical frequency converting means, comprising a nonlinear optical crystal, for converting said laser beam applied to said nonlinear optical crystal into a converted laser beam having an angular frequency different from the angular frequency of the laser beam, and for emitting said converted laser beam;
   current modulating means for producing a modulating signal to modulate a drive current supplied to said laser beam generating means;
   light detecting means for detecting an intensity of the converted laser beam emitted by said optical frequency converting means, and for producing an intensity signal representative of the detected intensity; and
   temperature regulating means for controlling temperature of said laser beam generating means based on said modulating signal from said current modulating means and said intensity signal from said light detecting means.

2. A harmonic generator according to claim 1, further comprising phase detecting means for detecting the phase of said intensity signal based on a modulation frequency of said modulating signal; said phase detecting means producing a phase signal for input to said temperature regulating means to control the temperature of said laser beam generating means to maintain the intensity of the converted laser beam at a substantially constant level.

3. A harmonic generator according to claim 2, wherein said phase detecting means compares the wavelength of the laser beam with a maximum-conversion-efficiency wavelength at which frequency conversion efficiency of said optical frequency converting means is a maximum.

4. A harmonic generator according to claim 3, wherein said temperature regulating means comprises means for lowering the temperature of said laser beam generating means when a wavelength of the laser beam is longer than said maximum-conversion efficiency wavelength, and for increasing the temperature of said laser beam generating means when the wavelength of the laser beam is shorter than said maximum-conversion-efficiency wavelength.

5. A harmonic generator according to claim 1, wherein said laser beam generating means comprises a semiconductor laser.

6. A harmonic generator according to claim 1, wherein said optical frequency converting means comprises a nonlinear optical crystal housed in a Fabry-Perot resonator having two spaced concave filter mirrors.

7. A harmonic generator according to claim 1, wherein said optical frequency converting means comprises a monolithic doubling cavity generating two second harmonics through phase matching.

8. A harmonic generator according to claim 1, wherein said optical frequency converting means comprises a ring-type resonator generating a second harmonic in one direction.

9. A method for generating stable optical harmonics comprising the following steps:
   a) producing a modulating signal to modulate a drive current supplied to a laser;
   b) generating a laser beam with said laser, said laser beam having an angular frequency;
   c) passing said laser beam through a nonlinear optical crystal to produce a converted laser beam, said converted laser beam having a different angular frequency from the laser beam;
   d) detecting the intensity of the converted laser beam to produce an intensity signal; and
   e) controlling the temperature of said laser based on to said modulating signal and said intensity signal.

10. A method for generating stable optical harmonics comprising the following steps:
    (a) producing a modulating signal to modulate a drive current supplied to a laser;
    (b) generating a laser beam with said laser, said laser beam having an angular frequency;
    (c) passing said laser beam through a nonlinear optical crystal to produce a converted laser beam, said converted laser beam having a different angular frequency from the laser beam;
    (d) detecting the intensity of the converted laser beam to produce an intensity signal; and
    (e) detecting the phase of said intensity signal with a phase detector to produce a phase detection signal;
    (f) controlling the temperature of said laser based on said detected phase detection signal.

11. A method for generating stable optical harmonics as claimed in claim 10, wherein said phase detector compares the wavelength of the laser beam with a maximum-conversion-efficiency wavelength at which the frequency conversion efficiency of said non-linear optical crystal is a maximum.

12. A method for generating stable optical harmonics as claimed in claim 11, wherein step (f) further comprises lowering the temperature of said laser when a wavelength of the laser beam is longer than said maximum-conversion efficiency wavelength, and increasing the temperature of said laser when the wavelength of the laser beam is shorter than said maximum-conversion-efficiency wavelength.

* * * * *